United States Patent
Goyal et al.

(10) Patent No.: US 12,196,804 B2
(45) Date of Patent: Jan. 14, 2025

(54) SYSTEM FOR SCAN MODE EXIT AND METHODS FOR SCAN MODE EXIT

(71) Applicant: NXP B.V., Eindhoven (NL)

(72) Inventors: Tarun Kumar Goyal, Jhunjhunu (IN); Nikila Krishnamoorthy, Chennai (IN)

(73) Assignee: NXP B.V., Eindhoven (NL)

( * ) Notice: Subject to any disclaimer, the term of this patent is extended or adjusted under 35 U.S.C. 154(b) by 133 days.

(21) Appl. No.: 18/053,411

(22) Filed: Nov. 8, 2022

(65) Prior Publication Data

US 2024/0094284 A1 Mar. 21, 2024

(30) Foreign Application Priority Data

Sep. 19, 2022 (IN) .............................. 202221053384

(51) Int. Cl.
*G01R 31/28* (2006.01)
(52) U.S. Cl.
CPC ....... *G01R 31/2882* (2013.01); *G01R 31/287* (2013.01)
(58) Field of Classification Search
None
See application file for complete search history.

(56) References Cited

U.S. PATENT DOCUMENTS

| | | | |
|---|---|---|---|
| 4,627,060 A | | 12/1986 | Huang et al. |
| 6,000,051 A | * | 12/1999 | Nadeau-Dostie ............................ G01R 31/31855 327/144 |
| 6,650,594 B1 | | 11/2003 | Lee et al. |
| 8,412,853 B2 | * | 4/2013 | Whetsel ......... G01R 31/318572 710/2 |
| 9,213,063 B2 | | 12/2015 | Jindal |
| 10,054,637 B2 | * | 8/2018 | Hao ................ G01R 31/31713 |
| 2008/0082884 A1 | | 4/2008 | Harada |
| 2013/0328583 A1 | * | 12/2013 | Wada ................ G01R 31/2884 324/750.3 |
| 2016/0187421 A1 | | 6/2016 | Oshiyama et al. |

FOREIGN PATENT DOCUMENTS

EP 1085331 A2 3/2001

* cited by examiner

*Primary Examiner* — Jermele M Hollington

(57) ABSTRACT

Resetting an integrated circuit (IC) by reset circuit of the IC comprises receiving a clock signal and a data signal. A sequence of bits of the data signal is stored in a memory based on the clock signal. A test mode signal is received and the sequence of bits is decoded in response to receiving the test mode signal. One of adjusting a counter value of a counter of the reset circuitry and outputting a reset signal corresponding to the counter value is performed based on the decoded sequence of bits.

18 Claims, 4 Drawing Sheets

SYSTEM FOR SCAN MODE EXIT AND METHODS FOR SCAN MODE EXIT

FIELD OF USE

The present disclosure relates generally to electronic testing and more particularly, to a system and method for scan mode exit during testing of an integrated circuit (IC).

BACKGROUND

Integrated circuits (ICs) are commonly tested using automatic test equipment (ATE) to detect hardware faults. The ATE performs tests on the IC which has design for test (DFT) features for gaining access to internal circuits of the IC to test for the hardware faults in the IC.

Joint Test Action Group (JTAG) standard IEEE 1149.1 Standard Test Access Port and Boundary-Scan Architecture is an industry standard that is widely used in automatic testing of ICs (and other circuits). Automatic test equipment (ATE) that complies with the JTAG standard has a JTAG interface with at least four pins to which the IC is connected. The four pins include test data in (TDI) pin, test data out (TDO) pin, test clock (TCK) pin, and test mode select (TMS) pin. The testing process includes configuring the IC and entering a scan test mode where test vectors are shifted into the IC via the TDI pin or via scan input pads of the IC to test for hardware faults in the IC. The hardware of the IC performs functions based on the test vectors and states of the IC as a result of performing the functions are stored in a scan chain. The IC outputs the states of the scan chain via the TDO pin or via scan output pads of the IC to the ATE and the states are compared to expected states to detect hardware faults in the IC. The scan mode is exit by performing a power-on-reset or global reset of the IC. The scan mode is repeatedly entered and exit for different configurations of the IC and for different voltages and temperatures during the testing process and the IC is power-on-reset or globally reset each time to exit the scan mode.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
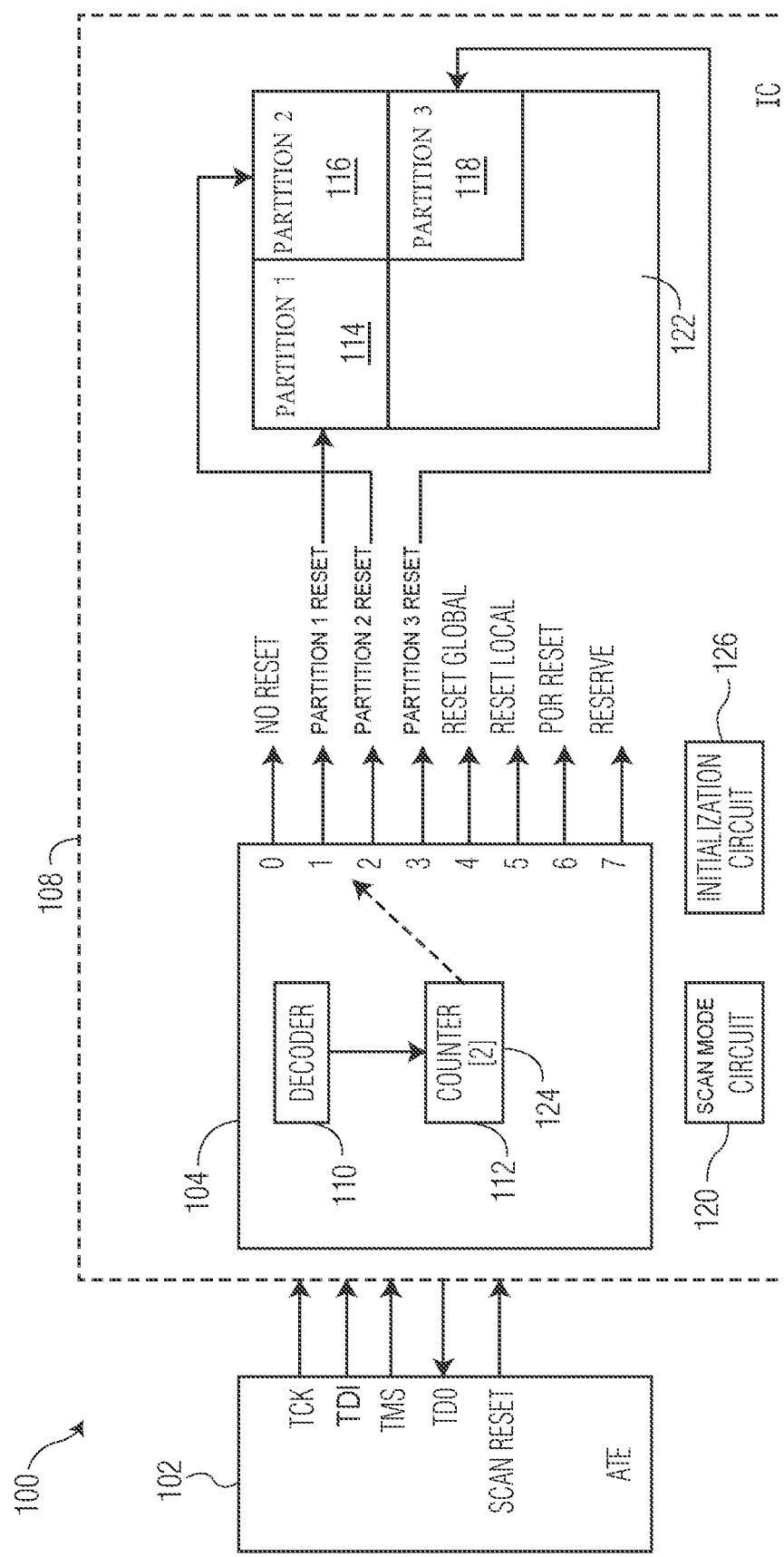
FIG. 1 is an example block diagram of testing apparatus which includes a reset circuit associated with selectively controlling a reset of an integrated circuit (IC) in accordance with an embodiment.

The detailed description of the appended drawings is intended as a description of the various embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Overview

Power-on-reset or global IC reset to exit the scan mode requires the IC to perform various initialization functions such as accessing flash memory, obtaining security keys, executing startup code, programming a phase lock loop or register, and trimming circuits among other initialization functions before entry into the scan mode again. Performing the initialization functions increases the scan test time, degrades the flash memory, and causes unnecessary programming of electronic-fuses (e-fuses) increasing cost of the testing process because such initialization functions are performed before each entry of the scan mode. In some implementations, the IC receives a signal on a pin indicative of global reset or power-on reset of the IC to exit the scan mode. Glitches on the pin of the IC could result in the IC being inadvertently reset also adding cost to the testing process.

Embodiments disclosed herein are directed to reducing time to exit the scan mode during the testing process. A plurality of signals are provided to a reset circuit of the IC to indicate a particular type of reset of the IC which includes indicating different partitions of the IC are to be reset to a known state rather than always resetting the entire IC by a global reset or power-on-reset. The plurality of signals includes one or more of test data input which indicates a plurality of sequences of bits, a clock signal which provides timing for storing each bit of the sequences of bits in the reset circuit, a test mode signal which indicates a timing for decoding a sequence of bits, and a scan reset signal which indicates that a reset is to be performed to exit the scan mode. Based on the plurality of signals, the reset circuit of the IC adjusts (e.g., increments) a counter value of a counter of the reset circuit one or more times and determines that a reset of the IC is to be performed. The reset circuit causes the IC to be reset in accordance with the type of reset indicated by the counter value. The type of reset of the IC is able to be controlled to selectively reset partitions of the IC to cause the IC to be reset at a granularity less than the entire IC, among other types of reset. Time to reset is further reduced because certain initialization associated with partitions which are not reset does not need to be performed. The disclosed reset to exit scan mode also reduces degradation of flash memory or an amount of programming of the e-fuse of the IC. The disclosed reset also avoids glitches on the pin of the IC causing the IC to be reset. Well known instructions, protocols, structures, and techniques have not been shown in detail in order not to obfuscate the description.

Example System

FIG. 1 is an example block diagram of testing apparatus 100 associated with selectively controlling a reset of an integrated circuit (IC) 108 in accordance with an embodiment. The testing apparatus 100 includes automatic test equipment (ATE) 102 and an IC 108 which may be a device under test (DUT).

The ATE 102 may facilitate performing various testing of the IC 108 including but not limited to configuring the IC 108 to enter a scan mode where test data is shifted into the IC 108 to test for hardware faults in the IC 108. The interface of the ATE 102 may be compatible with the Joint Test Action Group (JTAG) standard IEEE 1149.1 Standard Test Access Port and Boundary-Scan Architecture which an industry standard that is widely used in automatic testing of ICs (and other circuits). The ATE 102 may have a JTAG interface with at least four pins which include test data in (TDI) pin, test data out (TDO) pin, test clock (TCK) pin, and test mode select (TMS) pin. The test data may be provided to the TDI pin and input to the IC 108. Hardware of the IC may operate on the test data and test results are output by the IC 108 to the TDO pin of the ATE 102. The TCK pin may provide a clock signal to the IC 108 which establishes a timing associated with the DUT during the testing process. The TMS pin may provide a mode select to the IC 108 which indicates a manner by which the test data of the TDI pin is to be parsed during the testing.

The IC 108 may have a scan mode circuit 120, a reset circuit 104, a functional circuit 122, and an initialization circuit 126. The circuits of the IC 108 may include one or more of analog circuitry, mix signal circuitry, memory circuitry, logic circuitry, and processing circuitry that executes code stored in a memory that when executed by the processing circuitry performs the disclosed functions, among other implementations.

The functional circuit 122 may include logic circuitry associated with performing a function such as signal processing or data communication among other examples depending on a type of system in which the IC 108 is in. The initialization circuit 126 may perform initialization of the functional circuit 122. In an example, the initialization may include one or more of accessing flash memory, obtaining security keys, executing startup code, programming a phase lock loop or registers, programming electronic fuses (e-fuses) and trimming circuits among other initialization. The scan mode circuit 120 may facilitate testing of the IC 108 and in particular testing of the functional circuit 122. The TDI pin may receive the test data which causes a test data register (TDR) of the scan mode circuit 120 to be set to indicate that the IC 108 is to be placed in a scan mode. Further, the scan mode circuit 120 may generate an internal scan mode signal to cause the IC 108 to be placed in the scan mode. In the scan mode, the scan mode circuit 120 may further receive additional test data (e.g., test vectors) from the ATE 102 via the TDI pin to test for hardware faults in the functional circuit of the IC 108. The scan mode circuit 120 may cause states of the functional circuit 122 to be stored in one or more memory locations of the scan mode circuit 120 (e.g., scan chain) based on the functional circuit performing operations on the test vectors. For examples, the states may include a signal level at a logic circuit or pin of the IC 108. The states resulting from the testing stored in the scan mode circuit 120 are then output to the ATE 102 via the TDO pin and compared by the ATE 102 to expected states to detect hardware faults in the IC 108. The hardware faults may be due to manufacturing defects in the functional circuit 122 as an example.

The IC 108 typically exits the scan mode by performing a power-on-reset or global reset of the IC 108 to reset the entire IC 108. A reset is defined as placing the IC in a known state. The ATE 102 typically has a scan reset pin which provides a scan reset signal to a corresponding input of the IC 108 which indicates reset of the IC 108. The IC 108 may be tested for different configurations of the IC 108 and for different voltages and temperatures by repeatedly entering and exiting the scan mode and the IC 108 is power-on-reset or globally reset each time the scan mode is exit. The purpose of the global reset or power-on-reset is to place the IC 108 and the functional circuit 122 in a known state such a reset state for subsequent testing or for functional operation of the IC 108 in contrast to the scan mode. The global reset or power-on-reset further requires that the initialization circuit 126 perform the initialization between the scan mode entry and exit. Performing the initialization increases the testing process time and also degrades the flash memory due to read and write operations. Also, the reset could result unnecessary programming of the e-fuses of the IC 108 or might result in the IC 108 being inadvertently reset due to "glitches" on the scan reset pin. "Glitches" are a result of circuitry acting in unpredictable ways which may lead to a system failure.

Embodiments disclosed herein are directed to reducing time associated with exit and entry of the scan mode during testing of the IC 108. The IC 108 has a reset circuit 104 which receives a plurality of signals from the ATE 102 which indicate a particular type of reset of the IC 108 other than only a global reset or power-on-reset. In an example, the plurality of signals may include a clock signal received at the TCK pin, sequences of bits received at the TDI pin, and a bit sequence receipt signal received at the TMS pin. In some examples, the IC 108 may also receive a scan reset signal to indicate exit of the scan mode. The reset circuit 104 may have a decoder 110 and a counter 112. In an example, based on the scan mode signal indicating that the IC 108 is in the scan mode and the scan reset signal being asserted, the reset circuit 104 may determine a particular type of reset of the IC 108. The decoder 110 may receive the clock signal, the sequences of bits at the TDI pin, and the signal at the TMS pin and determine whether a sequence of bits which is a subset of the sequences of bits indicate to adjust a counter value of the counter 112 which controls the reset of the IC 108. The counter value of the counter 112 may be set to zero during the initialization and adjusted (e.g., incremented) each time the decoder 110 decodes a sequence of bits which indicates to adjust the counter value. For example, the decoder 110 may decode a sequence of bits of the sequences of bits each time a pulse of the bit sequence receipt signal is received. The decoder 110 may also determine whether a sequence of bits indicates that the reset circuit 104 is to output a signal to cause the functional circuit 122 to be reset. The counter value may indicate a type of the reset and in an example, the counter value of the counter 112 is set to 2 as shown by memory location 124 which then causes the IC 108 to perform a partition 2 reset as described in more detail below.

The type of the reset may vary based on the counter value. The functional circuit 122 may be subdivided into one or more circuit partitions examples which are shown as circuit partitions 114-118 which may be able to be independently reset, i.e., placed in a known state. The plurality of signals received by the reset circuit 104 may cause a particular circuit partition of the IC 108 to be reset. The reset circuit 104 shows that different signals are output based the counter value to reset different partitions, e.g., counter value 1 causes partition 114 to be reset, counter value 2 causes partition 116 to be reset, and counter value 3 causes partition 118 to be reset. Further, the counter value of zero indicates to not perform a reset. If the counter value is 4, then the reset circuit 104 may output a global reset signal 4 during which the entire functional circuit 122 is reset or a local reset signal when the counter value 5 to performs a local reset of the functional circuit 122. The local reset may be a reset of one or more circuits of the functional circuit 122 less than the entire functional circuit 122 such as a reset of multiple partitions. Further, the reset circuitry 104 may output a power on reset signal when the counter value is 5 which causes the IC 108 to held in a reset state while power is applied to the IC 108 so that processing of the functional circuit 122 does not start until power to the IC 108 is stable. The reset circuit 104 may also output a reserve signal when the counter value is 7 which causes the another operation on the functional circuit 122 which might or might not be related to the reset of the functional circuit 122. In examples, the reset circuit 104 may also output the counter value which is stored in the counter 112 to the TDO pin of the ATE 102 and received by the ATE 102.

The counter value to which the counter 112 is set and resulting signal output by the reset circuitry 104 may vary. For example, the reset circuit 104 may output different signals as shown for the different types of reset for each counter value. Further, the reset circuit 104 may generate fewer or more counter values and associated reset signals.

In examples, the type of reset of the IC 108 is able to be controlled to selectively reset partitions of the IC into a known state. The selective reset allows for reset of the IC 108 at a granularity less than the entire IC 108. Time of reset is further reduced because certain initialization associated with partitions which are not reset does not need to be performed. The disclosed reset to exit scan mode also reduces degradation of flash memory or programming of the e-fuse of the IC 108. The flash memory or e-fuse might not be accessed for each reset. Further, the use of the counter 112 to make a decision of whether to exit the scan mode and reset the IC 108 in addition to the scan reset signal avoids accidental triggering of the reset as a result of a glitch on the scan reset pin of the ATE 102.

Figure 2:
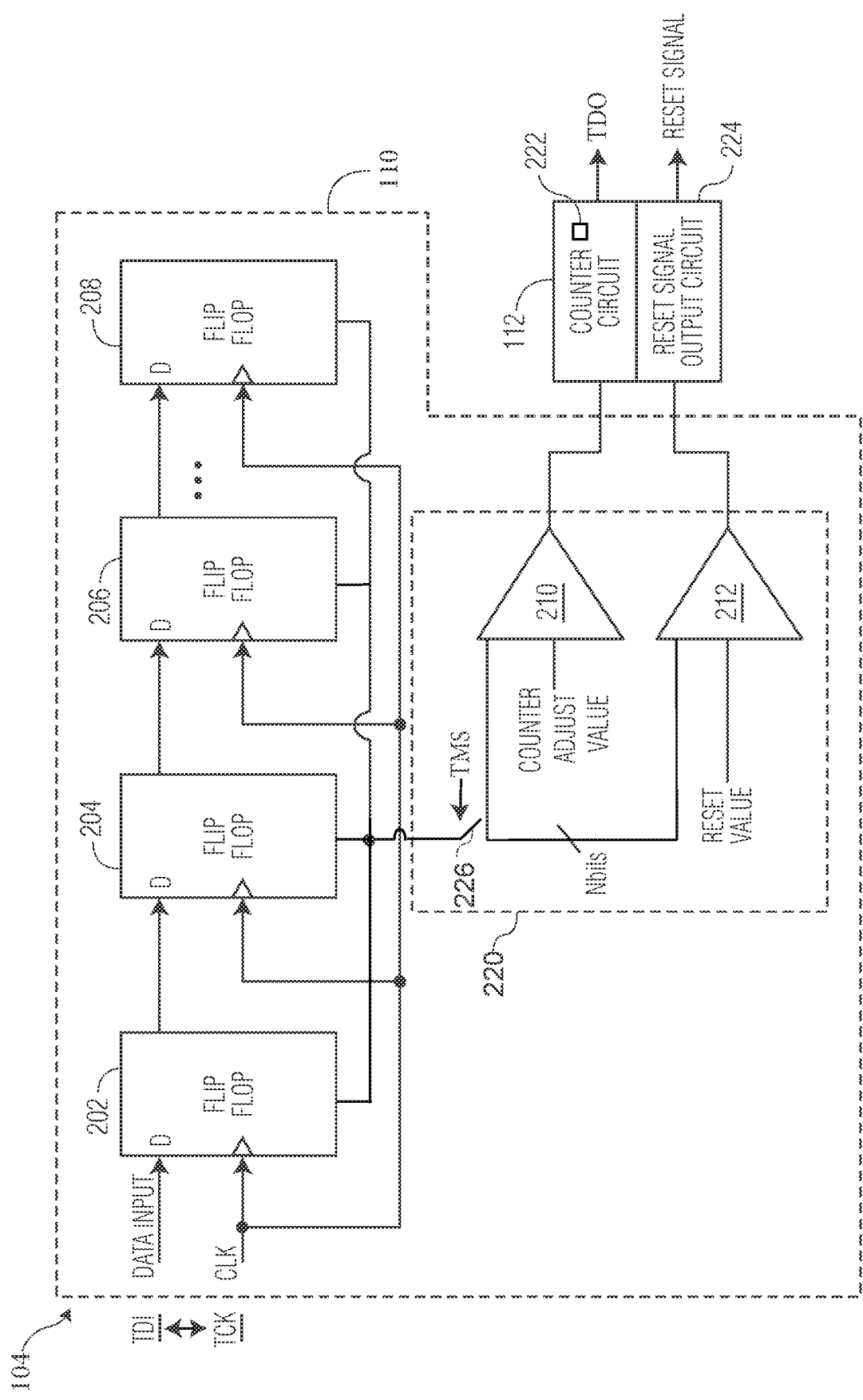
FIG. 2 is an example block diagram which illustrates the reset circuit in more detail in accordance with an embodiment.

FIG. 2 is an example block diagram which illustrates the reset circuit 104 in more detail in accordance with an embodiment. The reset circuit 104 may have the decoder 110 and the counter 112. The reset circuit 104 may further include a memory shown as a chain of N flip flops 202-208 in an example where N=4 and logic circuit 220. In other examples, N may range from 1-256. The counter 112 may have a memory location 222 which stores the counter value and logic (not shown) to adjust (e.g., increment) the counter 112. Each flip flop 202-208 may be a "D flip flop" or other type of flip flop which stores a bit in an example with an input to the flip flop being a data input D and a second input to the flip flop being a clock input. Further, an output of one flip flop is coupled to an input of another flip flop.

The flip flop 202 may receive at its data input a sequence of bits. For example, on each clock pulse of the clock signal, the bit in one flip flop is shifted to a subsequent flip flop and a new bit is received by the flip flop 202 at its data input. In an example, the data input D of the flip flop 202 may be coupled to the TDI pin and the clock input of each flip flop 202-208 may be coupled to the TCK pin from the ATE 102. On a clock cycle, flip flop 202 may receive a bit from the TDI pin, the bit previously in flip flop 202 may be shifted to flip flop 204, the bit previously in flip flop 204 may be shifted to flip flop 206, and the bit previously in flip flop 206 may be shifted to flip flop 208. The logic circuit 220 may further receive the bit sequence receipt signal of the TMS pin from the ATE 102. The bit sequence receipt signal from the TMS pin may be an indication that a sequence of bits is sent via the TDI pin to indicate either to adjust (e.g., increase) the counter value or to provide the reset signal associated with the counter value. In the example, the sequence of bits may be four bits stored by the four flip-flops. In response to the signal from the TMS pin, a circuit represented by switch 226 may provide the sequence of bits to one or more comparators to decode the sequence of bits. The comparators of the logic circuit 220 are shown in this example as comparators 210, 212. The sequence of bits stored in the flip flops may be provided to the comparators 210, 212 which each responsively compares the value of the sequence of bits stored in the flip flops to one of two values. If the comparator 210 indicates that the value of the sequence of bits equals a value indicative of an adjust in count value (i.e., counter adjust value), then the comparator 210 outputs a signal to the counter circuit 112 to increase a count value, e.g., i=i+1 where i is an integer in an example. For example, the value indicative of the increase in count value may be 0x3C and if the flip flops 202-208 store a value of 0x3C, then the count value of the counter 112 may be increased. If the comparator 212 indicates that the value of the sequence of bits equals a value indicative of outputting a reset signal (i.e., reset value), then the comparator 212 outputs a signal to the reset signal output circuit 224 which causes the reset circuit 104 to output the reset signal corresponding to the counter value. For example, the value indicative of the output of the reset signal may be 0x1D and if the flip flops 202-208 store a value of 0x1D, then the reset circuit 104 outputs the reset signal corresponding to the counter value which causes the functional circuit 122 to be reset in accordance with the reset signal. Further, the reset circuit 104 may output the counter value which is provided to the TDO pin.

In an example, the decoder 110 may decode the data input when the IC 108 is in the scan mode and the scan reset signal is asserted which indicates the IC 108 is to be reset to exit the scan mode. Further, signals provided between the IC 108 and the ATE 102 are described as being exchanged via pins but other input or output structures could be used including pads or bus structures. Further, the decoder 110 may be implemented with logic circuit other than comparators 210, 212 to determine whether to increment the counter 112.

In an example, the TCK pin of the ATE 102 may be coupled to the data input of the flip flop 202 and the TDI pin of the ATE 102 may be coupled to the clock input of the flip flop 202 instead of the TDI pin of the ATE 102 being coupled to the data input of the flip flop 202 and the TCK pin of the ATE 102 being coupled to the clock input of the flip flop 202-208. Further, the ATE 102 may input the data signal to the TCK pin of the ATE 102 and the clock signal input to the TDI pin of the ATE 102 to reset the IC 108. The inputs are reversed from convention to avoid the reset signal being trigged during the scan mode by a test vector provided to the TDI pin and the clock signal provided to the TCK pin. During normal scan mode operation, the clock signal which is an alternating pattern of ones and zeros and which is a data input to the flip flop corresponds to 0x55 or 0xAA sequence of bits and will not generate a sequence of bits equal to 0x3C, 0x1D in an example to trigger increment of the counter 112 or output of the reset signal.

Figure 3:
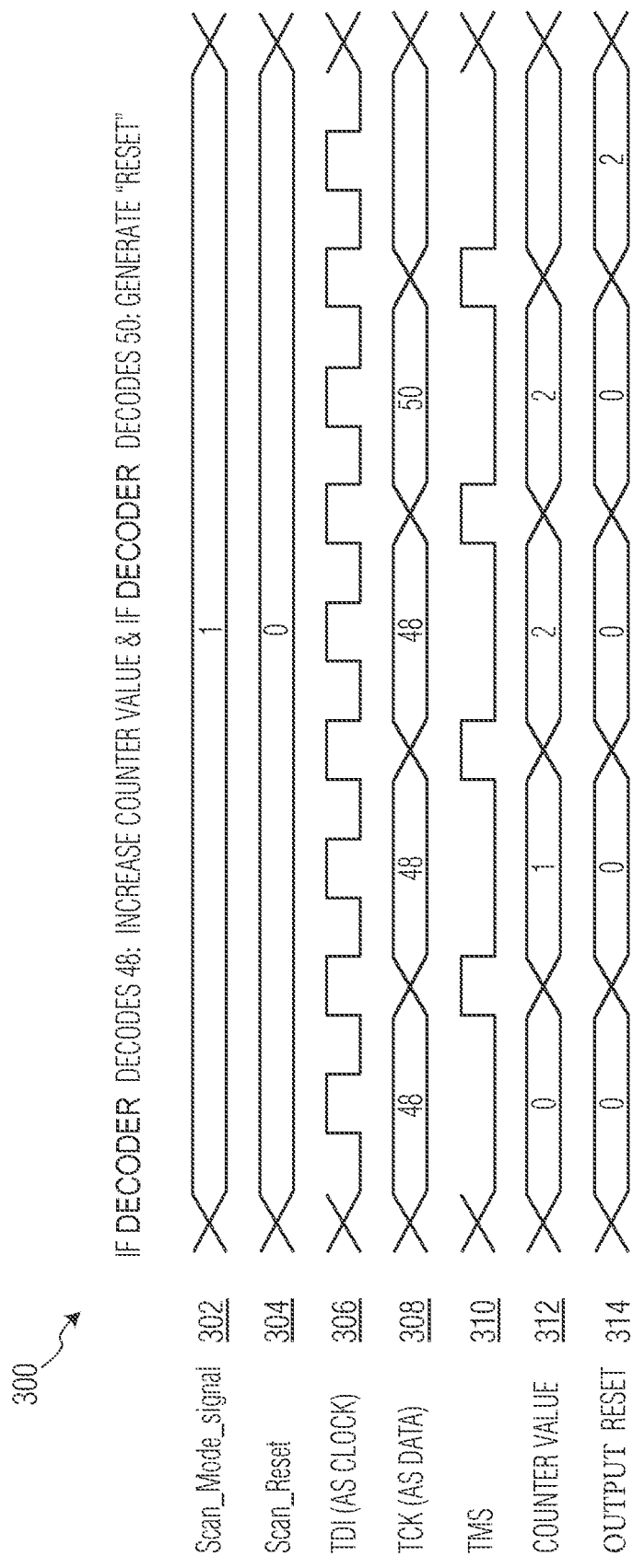
FIG. 3 illustrates example waveforms associated with the reset circuit in accordance with an embodiment.

FIG. 3 illustrates example waveforms 300 associated with the reset process in accordance with an embodiment. The waveforms 300 which are shown include a scan mode signal 302, scan reset signal 304, a clock signal 306 at the TDI pin, a data signal 308 at the TCK pin comprising sequences of bits, a bit sequence receipt signal 310 at the TMS pin, the counter value 312 and the reset signal 314. In an example, the scan mode signal 302 generated by the scan mode circuit 120 may be active high and indicate that the IC 108 is in a scan mode and the scan reset signal 304 may be active low to result in the decoder 110 decoding the data signal 308 which comprises a plurality of sequences of bits. The clock signal 306 may establish timing for receiving the sequence of bits and shifting a bit into a flip flop on each clock pulse. The bit sequence receipt signal 310 may indicate by a pulse that a sequence of bits representative of a value such 48 or 50 is stored in the flip flops. Each time a counter adjust value is received from the data signal 308 such as 48 in an example from the TCK pin, the counter value 312 of the counter 112 is adjusted (e.g., incremented). When a reset value is received such as 50 in an example via the data signal 308, the decoder 110 may cause the counter 112 to output the reset signal 314 indicated by the value of the counter 112 which is "2" to cause the electronic system 108 to be reset in accordance with the counter value. The reset may be in an example a reset of partition 2 of the functional circuit 122 in accordance with an embodiment.

Example Operations

Figure 4:
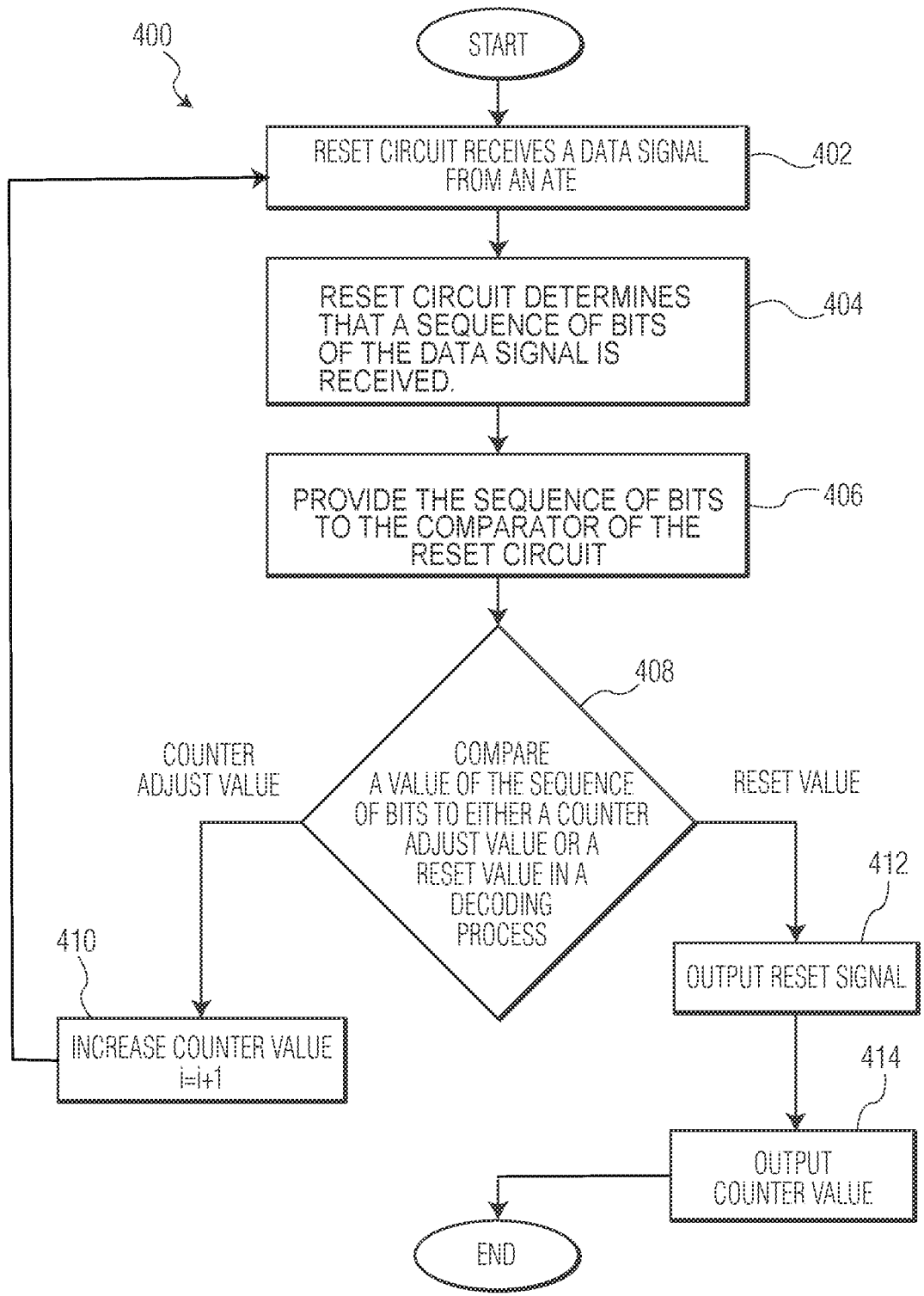
FIG. 4 is an example flow chart of functions associated with operation of the reset circuit in accordance with an embodiment.

FIG. 4 is an example flow chart 400 of functions associated with operation of the reset circuit 104 in accordance with an embodiment. At 402, the reset circuit 104 receives a data signal from an ATE. The data signal may define sequences of bits which indicate whether to adjust a counter value or output a reset signal and each bit of the sequences of bits is clocked into a chain of flip flops 202-208 based on the clock signal. At 404, the reset circuit 104 determines that a sequence of bits of the data signal is received. The sequence of bits may be stored in the flip flops and a pulse of the bit sequence receipt signal of the TMS pin may indicate that the sequence of bits is received. At 406, the sequence of bits is provided to comparator 210, 212 of the reset circuit 104. In an example, the switch 226 may provide the sequence of bits to the comparator. At 408, each comparator compares the sequence of bits to either a counter adjust value which indicates whether to adjust a counter value or a reset value in a decoding process. If the sequence of bits indicates the counter adjust value, then the counter value is adjusted at 410 and processing returns to step 402. If the sequence of bits indicates the reset value, then the reset signal corresponding to the counter value is output at 412. At 414, the reset circuitry 104 outputs the counter value which causes the functional circuit 122 to be reset in accordance with the reset signal.

In some examples, the IC 108 may additionally have a scan or general purpose input pads and output pad (not shown) to receive test data and output test results, respectively, in addition to the TDI and TDO pins. Functions described with respect to data of the TDI pin and TDO pin may be performed similarly based on test data of the input pads and test results of the output pads. Further, pins as described herein may be implemented as pads or other signal interfaces in accordance with an embodiment and are not limited to the described structure.

In an embodiment, a method for resetting an integrated circuit (IC) by reset circuit of the IC is disclosed. The method comprises: receiving a clock signal and a data signal; storing a sequence of bits of the data signal in a memory based on the clock signal; receiving a test mode signal; decoding the sequence of bits in response to receiving the test mode signal; and based on the decoded sequence of bits one of adjusting a counter value of a counter and outputting a reset signal corresponding to the counter value to reset at least a portion of a functional circuit of the IC. In an example, the test mode signal indicates that the sequence of bits of a bit length is stored in the memory. In an example, adjusting the counter value of the counter of the reset circuitry comprises comparing a value representing the sequence of bits to a counter adjust value and incrementing the counter based on the value representing the sequence of bits being equal to the counter adjust value. In an example, outputting the reset signal corresponding to the counter value comprises comparing the value representing the sequence of bits to a reset value and outputting the reset signal based on the value representing the sequence of bits being equal to the reset value. In an example, the reset signal indicates to reset only a portion of a functional circuit of the IC. In an example, the counter value of the counter of the reset circuitry is incremented when the counter value is an counter adjust value and the reset signal is output when the counter value is an reset value; and wherein the portion is indicated by the counter value when the sequence of bits is equal to the reset value. In an example, the method further comprises receiving a scan reset signal and a scan mode signal, and one of adjusting the counter value of the counter of the reset circuitry and outputting the reset signal corresponding to the counter value, the adjusting and outputting being based on an active high of the scan reset signal and an active low of the scan mode signal. In an example, a clock output pin of automatic test equipment is coupled to the first input and a data input of the automatic test equipment is coupled to the second input, wherein the clock output pin outputs the test data to the reset circuit and the data input provides the clock signal to the reset circuit. In an example, the test data does not include bits that represent 0xAA or 0x55. In an example, the method further comprises outputting, by the reset circuit, the counter value. In an example, the reset of the functional circuit of the IC is not a global reset or power on reset of the IC.

In another embodiment, an integrated circuit (IC) is disclosed. The IC comprises: a functional circuit; a reset circuit arranged to receive a clock signal and a data signal; store a sequence of bits of the data signal in a memory based on the clock signal; receive a test mode signal; and decode the sequence of bits in response to receiving the test mode signal; and a counter arranged to based on the decoded sequence of bits one of adjust a counter value and output a reset signal corresponding to the counter value to the functional circuit to reset at least a portion of a functional circuit of the IC. In an example, the test mode signal indicates that the sequence of bits of a bit length is stored. In an example, the counter arranged to adjust the counter value of the counter of the reset circuitry comprises the counter arranged to compare a value representing the sequence of bits to a counter adjust value and incrementing the counter based on the value representing the sequence of bits being equal to the counter adjust value. In an example, the counter arranged to output the reset signal corresponding to the counter value comprises the counter arranged to compare the value representing the sequence of bits to a reset value and outputting the reset signal based on the value representing the sequence of bits being equal to the reset value. In an example, the reset signal indicates to reset only a portion of a functional circuit of the IC. In an example, the counter value of the counter of the reset circuitry is incremented when the counter value is a counter adjust value and the reset signal is output when the counter value is a reset value; and wherein the portion is indicated by the counter value when the sequence of bits is equal to the reset value. In an example, the decoder is further arranged to receive a scan reset signal and a scan mode signal, and one of adjust the counter value of the counter of the reset circuitry and output the reset signal corresponding to the counter value, the adjusting and the output being based on an active high of the scan reset signal and an active low of the scan mode signal. In an example, a clock output pin of automatic test equipment is coupled to the first input and a data input of the automatic test equipment is coupled to the second input, wherein the clock output pin outputs test data to the reset circuit and the data input provides the clock signal to the reset circuit. In an example, the test data does not include bits that represent 0xAA or 0x55.

A few implementations have been described in detail above, and various modifications are possible. The disclosed subject matter, including the operations described in this specification, can be implemented in electronic circuit, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed Other implementations fall within the scope of the following claims.

What is claimed is:

1. A method for operating a reset circuit of an integrated circuit (IC), the method comprising:
    receiving, by the IC, a clock signal and a data signal from automatic test equipment;
    storing a sequence of bits of the data signal in a memory based on the clock signal;
    receiving, by the IC, a test mode signal;
    decoding the sequence of bits in response to receiving the test mode signal;
    based on the decoded sequence of bits indicating a counter adjust value, adjusting a counter value of a counter;
    based on the decoded sequence of bits indicating a reset value, outputting a reset signal to reset at least a portion of a plurality of portions of a functional circuit of the IC, wherein the counter value uniquely identifies which portion of the plurality of portions of the functional circuit is to be reset
    wherein the counter value of the counter of the reset circuitry is incremented when a value of the decoded sequence of bits is equal to the counter adjust value and the reset signal is output when the value of the decoded sequence of bits is equal to the reset value; and wherein the portion is indicated by the counter value when the value of the decoded sequence of bits is equal to the reset value.

2. The method of claim 1, wherein the test mode signal indicates that the sequence of bits is stored in the memory.

3. The method of claim 1, wherein adjusting the counter value of the counter of the reset circuitry comprises comparing a value representing the decoded sequence of bits to the counter adjust value and incrementing the counter based on the value representing the decoded sequence of bits being equal to the counter adjust value.

4. The method of claim 3, wherein outputting the reset signal corresponding to the counter value comprises comparing the value representing the decoded sequence of bits to the reset value and outputting the reset signal based on the value representing the decoded sequence of bits being equal to the reset value.

5. The method of claim 1, wherein the reset signal indicates to reset only a portion of the functional circuit of the IC.

6. The method of claim 1, further receiving a scan reset signal and a scan mode signal, and one of adjusting the counter value of the counter of the reset circuitry and outputting the reset signal corresponding to the counter value, the adjusting and outputting being based on an active high of the scan mode signal and an active low of the scan reset signal.

7. The method of claim 1, wherein a clock output pin of automatic test equipment is coupled to a first input of the IC and a data input of the automatic test equipment is coupled to a second input of the IC, wherein the clock output pin outputs the data signal to the first input of the IC which is provided to the reset circuit and the data input provides the clock signal to the second input of the IC which is provided to the reset circuit.

8. The method of claim 7, wherein the decoded sequence of bits based on the data input which is the clock signal does not include bits that represent 0x3C or 0x1D indicative of the counter adjust value or reset value, respectively.

9. The method of claim 1, further comprising outputting, by the reset circuit, the counter value.

10. The method of claim 1, wherein the reset of the functional circuit of the IC is not a global reset or power on reset of the IC.

11. An integrated circuit (IC) comprising:
    a functional circuit;
    a reset circuit arranged to receive a clock signal and a data signal from automatic test equipment; store a sequence of bits of the data signal in a memory based on the clock signal; receive a test mode signal; and decode the sequence of bits in response to receiving the test mode signal;
    a counter arranged to based on the decoded sequence of bits indicating a counter adjust value, adjust a counter value; and
    the reset circuit further arranged to based on the decoded sequence of bits indicating a reset value, output a reset signal to the functional circuit to reset at least a portion of the functional circuit of the IC, wherein the counter value uniquely identifies which portion of the plurality of portions of the functional circuit is to be reset, wherein the counter value of the counter of the reset circuitry is incremented when a value of the decoded sequence of bits is equal to the counter adjust value and the reset signal is output when the value of the decoded sequence of bits is equal to the reset value; and wherein the portion is indicated by the counter value when the value of the decoded sequence of bits is equal to the reset value.

12. The IC of claim 11, wherein the test mode signal indicates that the sequence of bits of a bit length is stored.

13. The IC of claim 11, wherein the counter arranged to adjust the counter value of the counter of the reset circuitry comprises the counter arranged to compare a value representing the decoded sequence of bits to the counter adjust value and incrementing the counter based on the value representing the decoded sequence of bits being equal to the counter adjust value.

14. The IC of claim 11, wherein the counter arranged to output the reset signal corresponding to the counter value comprises the counter arranged to compare the value representing the decoded sequence of bits to the reset value and outputting the reset signal based on the value representing the decoded sequence of bits being equal to the reset value.

15. The IC of claim 11, wherein the reset signal indicates to reset only a portion of the functional circuit of the IC.

16. The IC of claim 11, wherein the reset circuit is arranged to receive a scan reset signal and a scan mode signal, and one of adjust the counter value of the counter of the reset circuitry and output the reset signal corresponding to the counter value, the adjusting and the output being based on an active high of the scan mode signal and an active low of the scan reset signal.

17. The IC of claim 11, wherein a clock output pin of automatic test equipment is coupled to a first input of the IC and a data input of the automatic test equipment is coupled to a second input of the IC, wherein the clock output pin outputs the data signal to the first input of the IC which is provided to the reset circuit and the data input provides the clock signal to the second input of the IC which is provided to the reset circuit.

18. The IC of claim 17, wherein the decoded sequence of bits based on the data signal which is the clock signal does not include bits that represent 0x3C or 0x1D indicative of the counter adjust value or reset value, respectively.

* * * * *